United States Patent
Cheng

(10) Patent No.: US 7,786,764 B2
(45) Date of Patent: Aug. 31, 2010

(54) SIGNAL RECEIVER AND VOLTAGE COMPENSATION METHOD THEREOF

(75) Inventor: Wen-Chang Cheng, Taoyuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 49 days.

(21) Appl. No.: 12/406,943

(22) Filed: Mar. 18, 2009

(65) Prior Publication Data

US 2010/0176871 A1   Jul. 15, 2010

(30) Foreign Application Priority Data

Jan. 15, 2009   (TW) .............................. 98101362 A

(51) Int. Cl.
    *H03K 5/153*   (2006.01)
(52) U.S. Cl. ......................................... 327/72; 327/563
(58) Field of Classification Search ............. 327/65–67, 327/72, 89, 530–536; 330/253–254

See application file for complete search history.

(56) References Cited

U.S. PATENT DOCUMENTS 7,265,620 B2 *   9/2007   Liu et al. ..................... 330/253
2003/0193370 A1 * 10/2003   Leifso et al. ................ 330/254

* cited by examiner

*Primary Examiner*—Quan Tra
(74) *Attorney, Agent, or Firm*—Winston Hsu

(57) ABSTRACT

A signal receiver includes a first-stage circuit, a second-stage circuit, a current compensation circuit, and a biasing circuit. A first input end of the first-stage circuit receives a reference voltage, and a second end of the first-stage circuit receives an input signal. A first input end and a second input end of the second-stage circuit are respectively coupled to a first output end and a second output end of the first-stage circuit. The current compensation circuit is coupled to the first input end of the second-stage circuit for dynamically providing a compensation current to the first input end of the second-stage circuit in response to a biasing voltage, so as to stabilize its voltage level. The biasing circuit biases the first-stage circuit and the current compensation circuit and sets the biasing voltage of the current compensation circuit in response to the reference voltage.

7 Claims, 4 Drawing Sheets

SIGNAL RECEIVER AND VOLTAGE COMPENSATION METHOD THEREOF

BACKGROUND OF THE INVENTION

1. Field of the Invention

The present invention relates to a signal receiver and a related voltage compensation method, and more particularly, to a signal receiver and method for providing a compensation current to a first input end of a second-stage circuit of the signal receiver to stabilize its voltage level.

2. Description of the Prior Art

A semiconductor memory can be divided into two categories: a volatile memory, e.g. a dynamic random access memory (DRAM), and a non-volatile memory. The difference between these categories is whether the stored data can be reserved for a long time when external electric power is turned off. The data stored in the DRAM will disappear but the data stored in the non-volatile memory will be preserved.

Please refer to FIG. 1. FIG. 1 is a diagram showing a problem resulted from voltage offsets of a reference voltage in a signal receiver of a memory module according to the prior art. As shown in FIG. 1, $V_{REF}$ represents a reference voltage in a signal receiver of the memory module, offset reference voltages $V_{REF}'$ and $V_{REF}''$ respectively represent the offsets of the reference voltage $V_{REF}$, $V_{IN}$ represents an input signal of the signal receiver, and $V_{OUT}$ represents an output signal after the input signal $V_{IN}$ passes through the signal receiver. If there is no offset exists in the reference voltage $V_{REF}$, the output signal $V_{OUT}$ is generated after the input signal $V_{IN}$ passes through the signal receiver. If there is an offset exists in the reference voltage $V_{REF}$, such as the offset reference voltage $V_{REF}'$ or $V_{REF}''$, the output signal $V_{OUT}'$ or $V_{OUT}''$ is generated after the input signal $V_{IN}$ passes through the signal receiver. As can be known from FIG. 1, if there is an offset exists in the reference voltage $V_{REF}$, the delay time of the output signal $V_{OUT}'/V_{OUT}''$ at the rising edge is different from that at the falling edge, which affects the accuracy for accessing data of the memory module.

Hence, how to overcome such problem, resulted from the voltage offsets of the reference voltage in the signal receiver of the memory module, has become an important topic of the field.

SUMMARY OF THE INVENTION

It is one of the objectives of the claimed invention to provide a signal receiver and a related voltage compensation method to solve the abovementioned problems.

According to one embodiment, a signal receiver is provided. The signal receiver includes a first-stage circuit, a second-stage circuit, a current compensation circuit, and a biasing circuit. A first input end of the first-stage circuit receives a reference voltage, and a second end of the first-stage circuit receives an input signal. A first input end and a second input end of the second-stage circuit are respectively coupled to a first output end and a second output end of the first-stage circuit, and an output end of the second-stage circuit is used for outputting an output signal. The current compensation circuit is coupled to the first input end of the second-stage circuit for dynamically providing a compensation current to the first input end of the second-stage circuit in response to a biasing voltage, so as to stabilize its voltage level. The biasing circuit biases the first-stage circuit and the current compensation circuit, and sets the biasing voltage of the current compensation circuit in response to the reference voltage. The current compensation circuit is a current mirror circuit. The signal receiver is disposed inside a memory module.

According to another embodiment, a voltage compensation method applied to a signal receiver is provided. The signal receiver includes a first-stage circuit, a second-stage circuit, and a biasing circuit. A first input end of the second-stage circuit is coupled to a first output end of the first-stage circuit, and a second input end of the second-stage circuit is coupled to a second output end of the first-stage circuit. The method includes the steps of utilizing a first input end of the first-stage circuit to receive a reference voltage, utilizing a second input end of the first-stage circuit to receive an input signal, and biasing the first-stage circuit and dynamically providing a compensation current to the first input end of the second-stage circuit in response to the reference voltage to stabilize a voltage level of the first input end of the second-stage circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
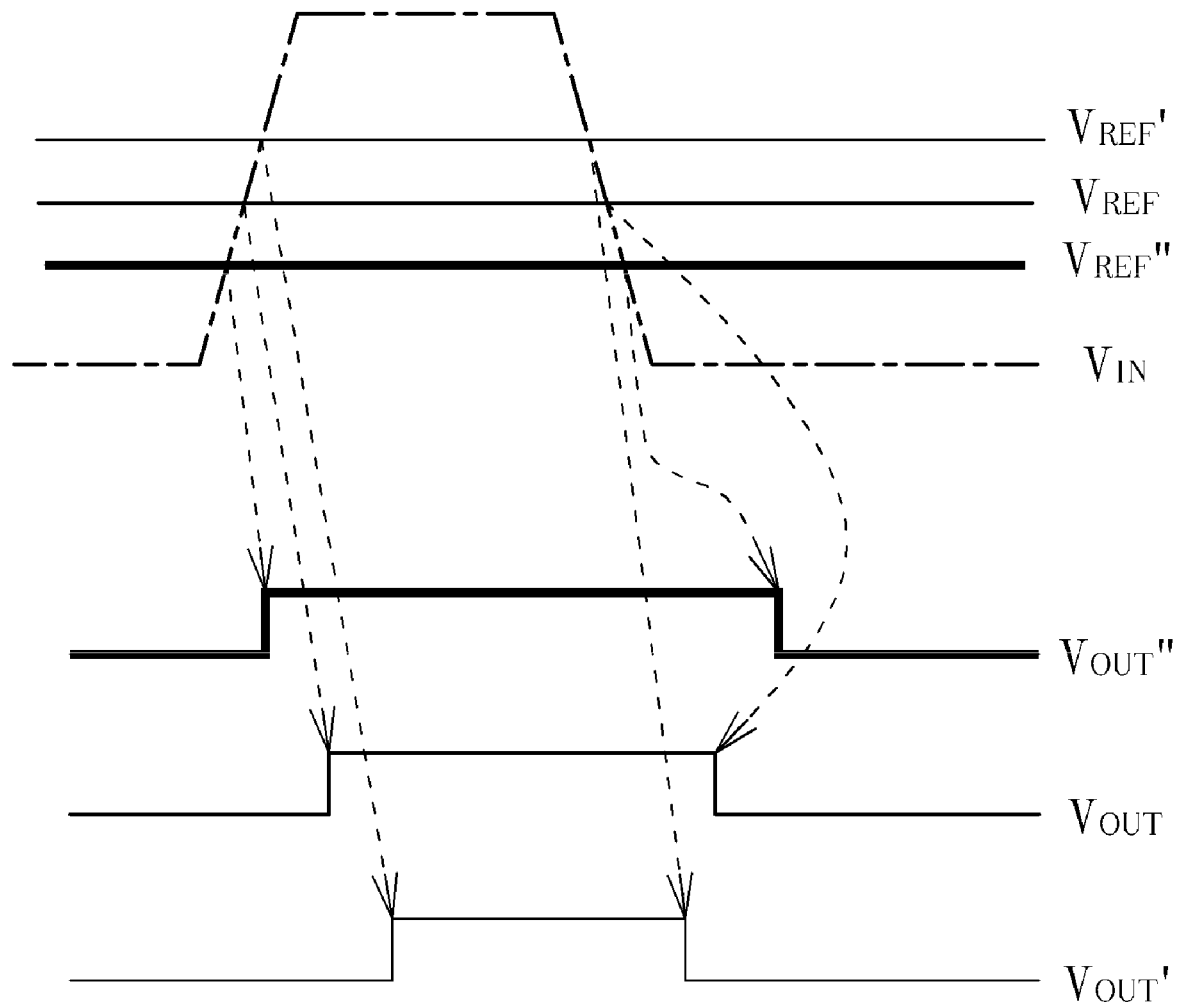
FIG. 1 is a diagram showing a problem resulted from voltage offsets of a reference voltage in a signal receiver of a memory module according to the prior art.
Figure 2:
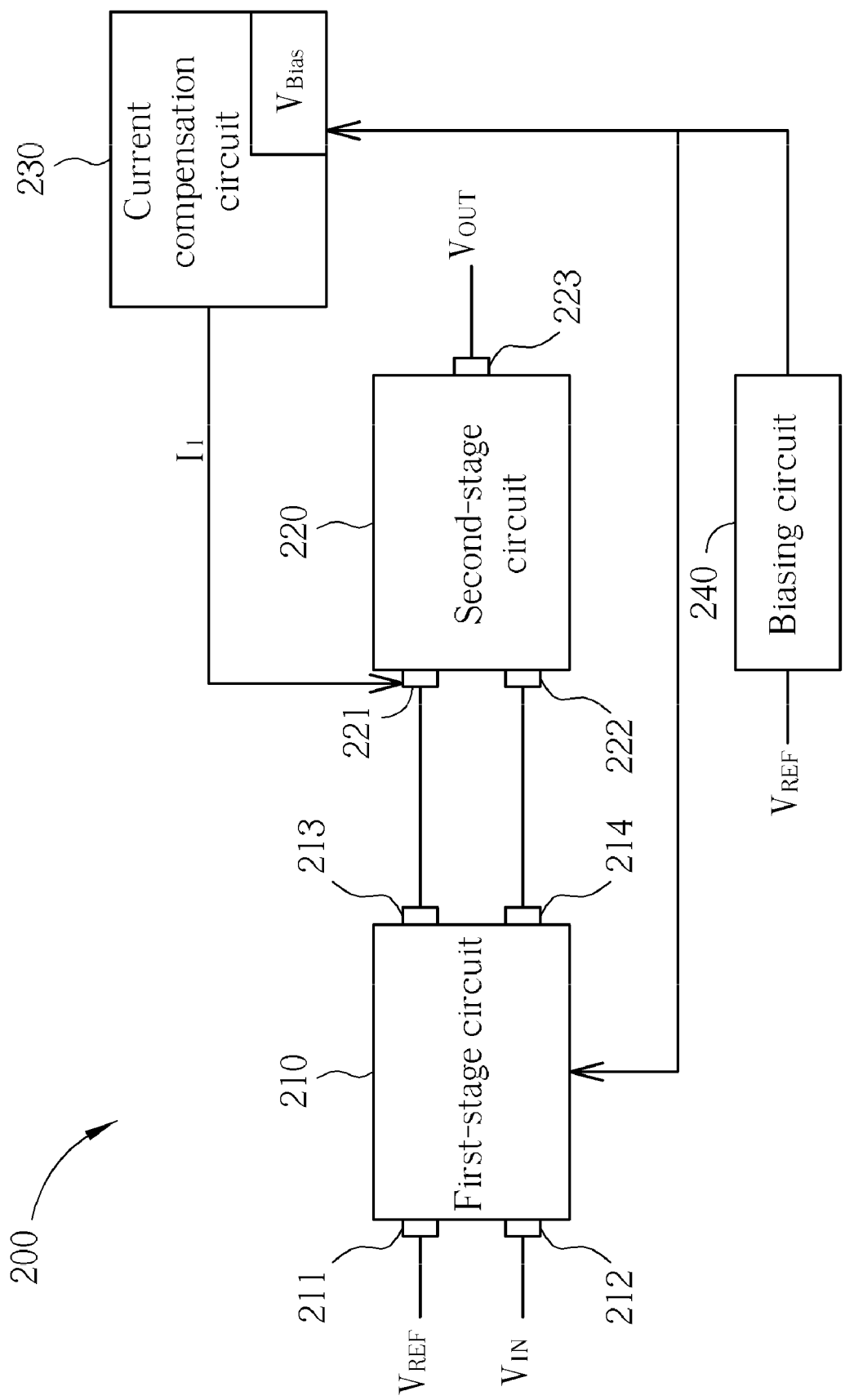
FIG. 2 is a block diagram of a signal receiver according to an embodiment of the present invention.

Please refer to FIG. 2. FIG. 2 is a block diagram of a signal receiver 200 according to an embodiment of the present invention. As shown in FIG. 2, the signal receiver 200 includes a first-stage circuit 210, a second-stage circuit 220, a current compensation circuit 230, and a biasing circuit 240. The first-stage circuit 210 has a first input end 211, a second input end 212, a first output end 213, and a second output end 214. The first input end 211 receives a reference voltage $V_{REF}$, the second input end 212 receives an input signal $V_{IN}$, and the first input end 211 and the second input end 212 are a differential signal pair. The second-stage circuit 220 has a first input end 221, a second input end 222, and at least one output end 223. The first input end 221 of the second-stage circuit 220 is coupled to the first output end 213 of the first-stage circuit 210, the second input end 222 of the second-stage circuit 220 is coupled to the second output end 214 of the first-stage circuit 210, and the first input end 221 and the second input end 222 of the second-stage circuit 220 are a differential signal pair. The output end 223 of the second-stage circuit 220 is used for outputting an output signal $V_{OUT}$. The current compensation circuit 230 is coupled to the first input end 221 of the second-stage circuit 220 for dynamically providing a compensation current $I_1$ to the first input end 221 of the second-stage circuit 220 in response to a biasing voltage $V_{Bias}$, so as to stabilize a voltage level $V_A$ at the first input end 221 of the second-stage circuit 220. The biasing circuit 240 is coupled to the first-stage circuit 210 and the current compensation circuit 230 for biasing the first-stage circuit 210 and the current compensation circuit 230 in response to the reference voltage $V_{REF}$, and for setting the biasing voltage $V_{Bias}$ of the current compensation circuit 230.

In this embodiment, the biasing voltage employed in the first-stage circuit 210 is the same as the biasing voltage $V_{Bias}$ employed in the current compensation circuit 230, but this should not be considered as a limitation of the present invention. In other embodiments, the first-stage circuit 210 and the current compensation circuit 230 can adopt different biasing voltages.

Figure 3:
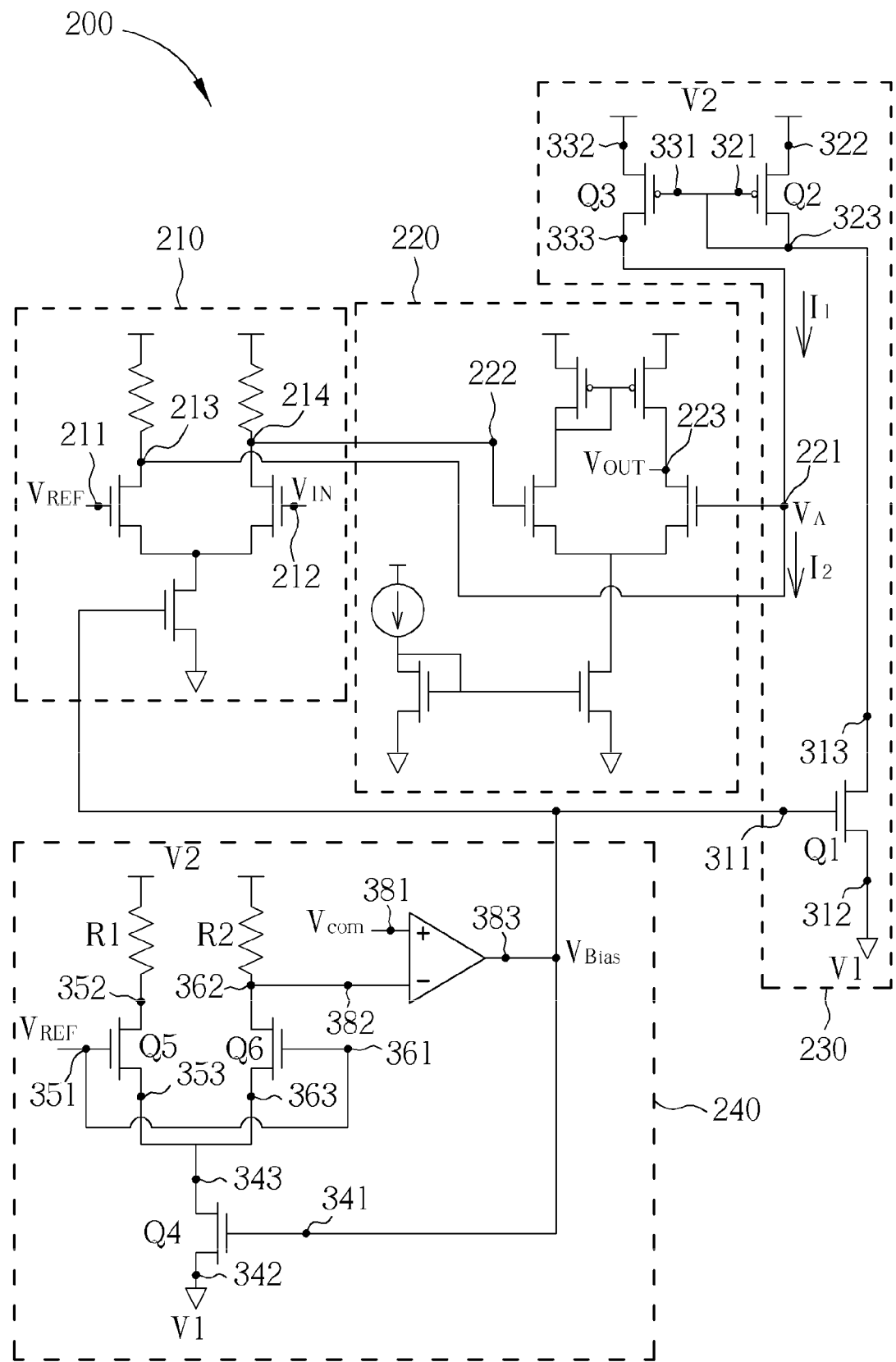
FIG. 3 is a diagram showing detailed circuits of the signal receiver shown in FIG. 2.

Please refer to FIG. 3. FIG. 3 is a diagram showing detailed circuits of the signal receiver 200 shown in FIG. 2. Each of the first-stage circuit 210 and the second-stage circuit 220 respectively includes a plurality of transistors, and the connection manner of the transistors is already shown in FIG. 3. In this embodiment, the current compensation circuit 230 is implemented by a current mirror circuit, which includes a first transistor Q1, a second transistor Q2, and a third transistor Q3. The first transistor Q1 has a control end 311, a first end 312, and a second end 313, wherein the control end 311 is coupled to the first-stage circuit 210 and the biasing circuit 240, the first end 312 is coupled to a first supply voltage V1. The second transistor Q2 has a control end 321, a first end 322, and a second end 323, wherein the control end 321 and the second end 323 are coupled to the second end 313 of the first transistor Q1, and the first end 322 is coupled to a second supply voltage V2. The third transistor Q3 has a control end 331, a first end 332, and a second end 333, wherein the control end 331 is coupled to the control end 321 of the second transistor Q2, the first end 332 is coupled to the second supply voltage V2, and the second end 333 is coupled to the first input end 221 of the second-stage circuit 220.

Please keep referring to FIG. 3. The biasing circuit 240 includes a fourth transistor Q4, a fifth transistor Q5, a sixth transistor Q6, and a comparator 380. The fourth transistor Q4 has a control end 341, a first end 342, and a second end 343, wherein the control end 341 is coupled to the control end 311 of the first transistor Q1 and the first-stage circuit 210, and the first end 342 is coupled to the first supply voltage V1. The fifth transistor Q5 has a control end 351, a first end 352, and a second end 353, wherein the control end 351 receives the reference voltage $V_{REF}$, the first end 352 is coupled to the second supply voltage V2 via a first loading R1, and the second end 353 is coupled to the second end 343 of the fourth transistor Q4. The sixth transistor Q6 has a control end 361, a first end 362, and a second end 363, wherein the control end 361 receives the reference voltage $V_{REF}$, the first end 362 is coupled to the second supply voltage V2 via a second loading R2, and the second end 363 is coupled to the second end 343 of the fourth transistor Q4. The comparator 380 has a first input end 381, a second input end 382, and an output end 383, wherein the first input end 381 receives a common voltage $V_{COM}$, the second input end 382 is coupled to the first end 362 of the sixth transistor Q6, and the output end 383 is coupled to the first-stage circuit 210 and the first transistor Q1 of the current mirror circuit 230. The comparator 380 compares the received signals at the first input end 381 and the second input end 382 to generate the biasing voltage $V_{Bias}$. In one embodiment, the biasing circuit 240 can generate the same biasing voltage to both the first-stage circuit 210 and the current mirror circuit 230, but this should not be considered as limitations of the present invention.

Please note that, in this embodiment, the first transistor Q1 is an N-type transistor, and each of the second transistor Q2 and the third transistor Q3 is a P-type transistor, but the present invention is not limited to this only. Furthermore, the abovementioned current compensation circuit 230 is merely an example for illustrating the present invention, and should not be a limitation of the present invention. Those skilled in the art will readily observe that numerous modifications and alterations of the implementation of the current compensation circuit 230 may be made without departing from the spirit of the present invention.

Please also note that the aforementioned signal receiver 200 can be disposed inside a memory module, and the input signal $V_{IN}$ can be a data signal (DQ signal) of the memory module.

In the following, several examples are taken for illustrating how the current compensation circuit 230 provides the compensation current $I_1$ to the first input end 221 of the second-stage circuit 220 to stabilize the voltage level $V_A$. In a first example, when the reference voltage $V_{REF}$ is increased, the voltage level $V_A$ at the first input end 221 of the second-stage circuit 220 will be decreased. At this time, the voltage at the second input end 382 of the comparator 380 is smaller than the common voltage $V_{COM}$ at the first input end 381, and then the comparator 380 increases the biasing voltage $V_{Bias}$ of the current compensation circuit 230. Due to the biasing voltage $V_{Bias}$ of the current compensation circuit 230 being increased, the compensation current $I_1$ is increased by the current compensation circuit 230 to increase the current $I_2$ flowing through the first input end 221 of the second-stage circuit 220, so as to compensate and stabilize the voltage level $V_A$ at the first input end 221 of the second-stage circuit 220. In a second example, when the reference voltage $V_{REF}$ is decreased, the voltage level $V_A$ at the first input end 221 of the second-stage circuit 220 will be increased. At this time, the voltage at the second input end 382 of the comparator 380 is greater than the common voltage $V_{COM}$ at the first input end 381, and then the comparator 380 decreases the biasing voltage $V_{Bias}$ of the current compensation circuit 230. Due to the biasing voltage $V_{Bias}$ of the current compensation circuit 230 being decreased, the compensation current $I_1$ is decreased by the current compensation circuit 230 to decrease the current $I_2$ flowing through the first input end 221 of the second-stage circuit 220, so as to compensate and stabilize the voltage level $V_A$ at the first input end 221 of the second-stage circuit 220. Therefore, the voltage level $V_A$ at the first input end 221 of the second-stage circuit 220 will not be affected by the offset of the reference voltage $V_{REF}$.

As can be known from the descriptions above, the signal receiver 200 and the voltage compensation mechanism disclosed in the present invention can stabilize the voltage level $V_A$ at the first input end 221 of the second-stage circuit 220 by adopting the current compensation circuit 230. Even if there is an offset exists in the reference voltage $V_{REF}$, it will not cause the delay time of the output signal $V_{OUT}$ at the rising edge to be different from that at the falling edge, so as to ensure the accuracy for accessing data of the memory module.

Figure 4:
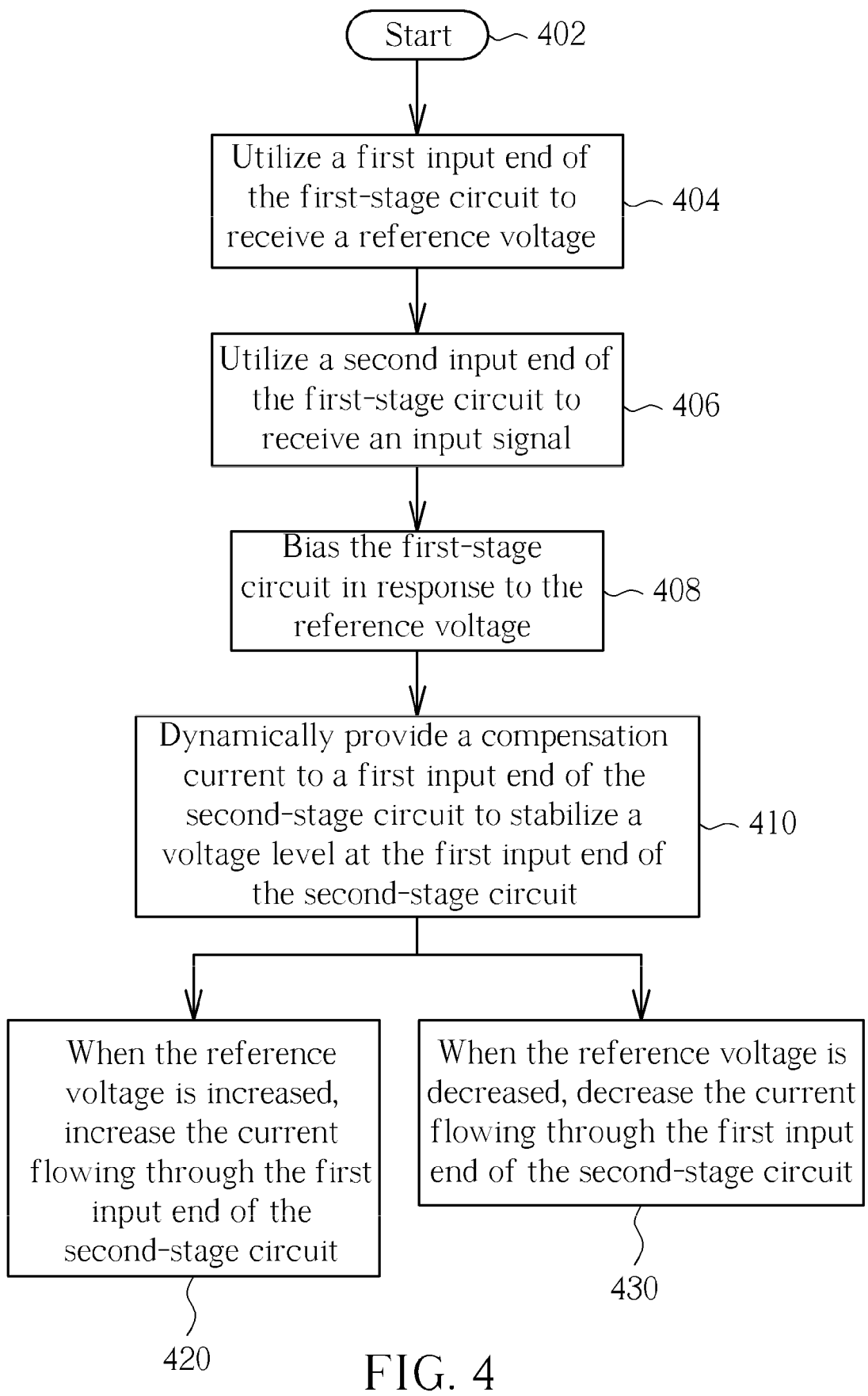
FIG. 4 is a flowchart illustrating a voltage compensation method applied to a signal receiver according to an exemplary embodiment of the present invention.

Please refer to FIG. 4. FIG. 4 is a flowchart illustrating a voltage compensation method applied to a signal receiver according to an exemplary embodiment of the present invention. Please note that the following steps are not limited to be performed according to the exact sequence shown in FIG. 4 if a roughly identical result can be obtained. The method includes the following steps:

Step 402: Start.

Step 404: Utilize a first input end of the first-stage circuit to receive a reference voltage.

Step 406: Utilize a second input end of the first-stage circuit to receive an input signal.

Step 408: Bias the first-stage circuit in response to the reference voltage.

Step 410: Dynamically provide a compensation current to the first input end of the second-stage circuit to stabilize a voltage level at the first input end of the second-stage circuit.

Step 420: When the reference voltage is increased, increase a current flowing through the first input end of the second-stage circuit.

Step 430: When the reference voltage is decreased, decrease the current flowing through the first input end of the second-stage circuit.

How each element operates can be known by collocating the steps shown in FIG. 4 and the elements shown in FIG. 2 and FIG. 3. Further description of the operations of each step shown in FIG. 4 is therefore omitted here for brevity. Be noted that the steps 410~430 are executed by the current compensation circuit 230.

The steps of the flowchart mentioned above are merely a practicable embodiment of the present invention, and should not be taken as a limitation of the present invention. The method can include other intermediate steps or can merge several steps into a single step without departing from the spirit of the present invention.

The abovementioned embodiments are presented merely for describing the present invention, and in no way should be considered to be limitations of the scope of the present invention. In summary, the present invention provides a signal receiver and a related voltage compensation method. By utilizing a current compensation circuit (such as a current mirror) to provide the compensation current to the first input end 221 of the second-stage circuit 220 of the signal receiver, the compensation current $I_1$ is increased to increase the current $I_2$ flowing through the first input end 221 of the second-stage circuit 220 if the reference voltage $V_{REF}$ is increased, while the compensation current $I_1$ is decreased to decrease the current $I_2$ flowing through the first input end 221 of the second-stage circuit 220 if the reference voltage $V_{REF}$ is decreased. Therefore, the voltage level $V_A$ at the first input end 221 of the second-stage circuit 220 will not be affected by the offset of the reference voltage $V_{REF}$. Even if there is an offset exists in the reference voltage $V_{REF}$, it will not cause the delay time of the output signal $V_{OUT}$ at the rising edge to be different from that at the falling edge, so as to ensure the accuracy for accessing data of the memory module.

Those skilled in the art will readily observe that numerous modifications and alterations of the device and method may be made while retaining the teachings of the invention.

What is claimed is:

1. A signal receiver, comprising:
    a first-stage circuit, having a first input end, a second input end, a first output end, and a second output end, the first input end receiving a reference voltage and the second input end receiving an input signal;
    a second-stage circuit, having a first input end, a second input end, and at least one output end, the first input end of the second-stage circuit coupled to the first output end of the first-stage circuit, the second input end of the second-stage circuit coupled to the second output end of the first-stage circuit, and the at least one output end used for outputting an output signal;
    a current compensation circuit, coupled to the first input end of the second-stage circuit, for dynamically providing a compensation current to the first input end of the second-stage circuit in response to a first biasing voltage, so as to stabilize a voltage level at the first input end of the second-stage circuit; and
    a biasing circuit, coupled to the first-stage circuit and the current compensation circuit, for biasing the first-stage circuit and the current compensation circuit in response to the reference voltage and for setting the first biasing voltage of the current compensation circuit.

2. The signal receiver of claim 1, wherein the current compensation circuit is a current mirror circuit, the current mirror circuit comprising:
    a first transistor, having a control end, a first end, and a second end, the control end coupled to the first-stage circuit and the biasing circuit, and the first end coupled to a first supply voltage;
    a second transistor, having a control end, a first end, and a second end, the control end and the second end of the second transistor coupled to the second end of the first transistor, and the first end of the second transistor coupled to a second supply voltage; and
    a third transistor, having a control end, a first end, and a second end, the control end of the third transistor coupled to the control end of the second transistor, the first end of the third transistor coupled to the second supply voltage, and the second end of the third transistor coupled to the first input end of the second-stage circuit.

3. The signal receiver of claim 2, wherein the first transistor is an N-type transistor, and each of the second transistor and the third transistor is a P-type transistor.

4. The signal receiver of claim 2, wherein the biasing circuit generates a second biasing voltage to the first-stage circuit, and the second biasing voltage is equal to the first biasing voltage of the current mirror circuit.

5. The signal receiver of claim 1, wherein a voltage level of the reference voltage corresponds to a current flowing through the first input end of the second-stage circuit.

6. A voltage compensation method applied to a signal receiver, the signal receiver comprising a first-stage circuit, a second-stage circuit, and a biasing circuit, a first input end of the second-stage circuit coupled to a first output end of the first-stage circuit, and a second input end of the second-stage circuit coupled to a second output end of the first-stage circuit, the method comprising:
    utilizing a first input end of the first-stage circuit to receive a reference voltage;
    utilizing a second input end of the first-stage circuit to receive an input signal; and
    biasing the first-stage circuit and dynamically providing a compensation current to the first input end of the second-stage circuit in response to the reference voltage to stabilize a voltage level at the first input end of the second-stage circuit.

7. The voltage compensation method of claim 6, wherein a voltage level of the reference voltage corresponds to a current flowing through the first input end of the second-stage circuit.

* * * * *